United States Patent
Stafford et al.

(10) Patent No.: US 9,661,377 B2
(45) Date of Patent: May 23, 2017

(54) DIGITAL DATA PROCESSING APPARATUS AND METHOD

(71) Applicant: Global Invacom Ltd., Stevenage, Hertfordshire (GB)

(72) Inventors: Gary Stafford, Stevenage (GB); Graham Leach, Stevenage (GB); Ian Watson, Stevenage (GB)

(73) Assignee: Global Invacom Ltd., Stevenage, Hertfordshire (GB)

( * ) Notice: Subject to any disclaimer, the term of this patent is extended or adjusted under 35 U.S.C. 154(b) by 68 days.

(21) Appl. No.: 14/410,677

(22) PCT Filed: Jul. 2, 2013

(86) PCT No.: PCT/GB2013/051751
§ 371 (c)(1),
(2) Date: Mar. 5, 2015

(87) PCT Pub. No.: WO2014/006395
PCT Pub. Date: Jan. 9, 2014

(65) Prior Publication Data
US 2015/0281766 A1    Oct. 1, 2015

(30) Foreign Application Priority Data

Jul. 2, 2012    (GB) .................................. 1211670.3

(51) Int. Cl.
| | |
|---|---|
| *H04N 7/16* | (2011.01) |
| *H04N 21/438* | (2011.01) |
| *H04H 20/63* | (2008.01) |
| *H04H 40/90* | (2008.01) |
| *H03D 7/16* | (2006.01) |

(52) U.S. Cl.
CPC ......... *H04N 21/4383* (2013.01); *H03D 7/163* (2013.01); *H03D 7/165* (2013.01); *H04H 20/63* (2013.01); *H04H 40/90* (2013.01)

(58) Field of Classification Search
CPC ..................... H04N 21/4383; H04N 21/42221
See application file for complete search history.

(56) References Cited

U.S. PATENT DOCUMENTS

| | | | |
|---|---|---|---|
| 2005/0239428 A1 | 10/2005 | Seendripu et al. | |
| 2006/0078069 A1* | 4/2006 | Seendripu .............. | H03D 7/166 375/316 |

(Continued)

FOREIGN PATENT DOCUMENTS

WO    2009/0143082    11/2009

*Primary Examiner* — Junior Mendoza
(74) *Attorney, Agent, or Firm* — Gable Gotwals

(57) ABSTRACT

There is provided an apparatus and a method for the receipt and processing of data signals carried in a plurality of predefined frequency bands and allowing a frequency band required at an instant of time to be selected from the predefined frequency bands from which data is to be retrieved. Passing the data signals from the wanted band to a transmitter and/or receiver including first and second mixing means to process the data signals, typically using in-phase and quadrative data feeds to create a predefined representation of the wanted frequency band, to provide an output for receipt by at least one broadcast data receiver and at least the transmitter and/or receiver is provided as part of an integrated circuit rather than as separate connected components.

17 Claims, 6 Drawing Sheets

(56) References Cited

U.S. PATENT DOCUMENTS

| | | | |
|---|---|---|---|
| 2006/0083335 A1 | 4/2006 | Seendripu et al. | |
| 2008/0225168 A1* | 9/2008 | Ouslis | H04N 5/4401 348/554 |
| 2009/0290659 A1* | 11/2009 | Petrovic | H04H 20/30 375/340 |
| 2011/0105068 A1* | 5/2011 | Reddy | H04B 1/0014 455/207 |

* cited by examiner

| Band Name | Frequency Designation | Output from LNB (GHz) | Output from IC (GHz) |
|---|---|---|---|
| T | Terrestrial | 0.2<br>0.86 | 0.2<br>0.86 |
| A | Vertical Low | 0.95<br>1.95 | 0.95<br>1.95 |
| B | Vertical High | 1.95<br>3.0 | 1.1<br>2.15 |
| C | Horizontal Low | 3.4<br>4.4 | 0.95<br>1.95 |
| D | Horizontal High | 4.4<br>5.45 | 1.1<br>2.15 |

DIGITAL DATA PROCESSING APPARATUS AND METHOD

CROSS-REFERENCE TO RELATED APPLICATIONS

This application is the United States National Phase of PCT Patent Application No. GB2013/051751 filed on 2 Jul. 2013, which claims priority to British Patent Application No. 1211670.3 filed 2 Jul. 2012, each of which are incorporated herein by reference.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

BACKGROUND OF THE INVENTION

The invention to which this application relates is an apparatus and method which allows the processing of received digital data and particularly which is for use in generating video and/or audio which is transmitted over a range of frequency bands and/or over a number of transponder frequencies within each frequency band.

The transmission of audio and/or video data via satellite and/or cable transmission systems is well known, as is the processing of the received data at a particular location, such as, in a satellite system, via an LNB (Low Noise Block) connected to one or more broadcast data receivers or set top boxes. The receivers decode the received data upon receipt of the user selection of a particular channel to be viewed or listened to. The data for each channel is typically provided to the receiver, with, in one embodiment, each transponder, of a range of transponders carrying data for at least one particular channel available for user selection. Typically groups of transponders are provided in a frequency band and a number of frequency bands can be received by the apparatus.

The applicant has developed apparatus which is of utility for a single dweller location with multiple rooms and multiple dweller locations such as an apartment block or a housing estate in which common receiving apparatus is provided to receive the transmitted data and then distribute the received data, preferably via an optical system, to each of the rooms, apartment blocks or houses. All of the data is then available for selection at each location by the user at the location. Although this invention is of particular use with multiple dweller units this type of system is not exclusively for such use and, as stated above, another possible use is in relation to single dweller units within which there are provided a number of different rooms (hereinafter referred to as receiving locations) in which the received data is required to be used.

At each location there is required to be provided apparatus which allows all of the data carried on the range of frequency bands to be available at the required frequencies for the set top box or one or more tuners so that the same can be successfully accessed and processed by the broadcast data receiver or one or more tuners. There is also typically a need for more than one output connection so as to allow more than one set top box or tuner to be connected to the apparatus at the location.

Conventionally, the apparatus at each location has been formed using a collection of discrete components which are interconnected. However, this form of apparatus is relatively bulky in size which makes its installation at many locations problematic and, also, with regard to potential high volume manufacture, expensive and generally unsatisfactory.

BRIEF SUMMARY OF THE INVENTION

The aim of the present application is to provide apparatus for receiving optical and/or RF signals and allowing the same to be provided in a form suitable for selection, access and processing by at least one broadcast data receiver or one or more tuners connected thereto.

In a first aspect of the invention there is provided apparatus for the receipt and processing of data signals carried in a plurality of predefined frequency bands, said apparatus including means to allow the communication of a signal to identify the wanted frequency band to be selected from the said predefined frequency bands and from which data is to be retrieved from, and at least one transmitter and/or receiver, wherein said transmitter has an input with two data feeds leading to first mixing means to process the data signals retrieved from the said wanted frequency band and passing the data from the two data feeds via filters to a second mixing means to convert the wanted frequency band to the required frequency band for receipt by at least one broadcast data receiver and/or one or more tuners connected to an output from the transmitter and at least the transmitter and/or receiver is provided as part of an integrated circuit.

Preferably in-phase and quadrative data feeds are provided to the transmitter to feed at least one of the first or second mixing means to create a predefined representation of the wanted frequency band. In one embodiment the in-phase and quadrative data feeds are connected to both the first and second mixing means In one embodiment the first mixing means includes a plurality of mixers arranged in parallel.

In one embodiment, the wanted frequency band is centred around or as close as possible to the Direct Current (DC) location in the frequency range and allows the filtering of the appropriate, wanted band, more efficiently. In one embodiment, the number and frequency ranges of the transponders located within the wanted frequency band are identified and the location of the gaps between the transponder frequency ranges are also identified.

Typically, and preferably rather than the band being centred around DC, one of the identified gaps between the transponder frequencies in the wanted frequency band is moved to or as close to the DC by the mixing means, typically the first mixing means. This is done to minimise the risk of interference due to unwanted signals as the aim is to move the wanted frequency band such that the said gap is located at the same place as the unwanted signals so as to avoid the same being located at the transponder frequency ranges in the wanted frequency band.

Typically the gap between transponder frequencies in the wanted band which is located closest to the centre of the wanted frequency band is that which is moved to DC by the mixing means.

Typically one output is provided for each tuner.

In one embodiment ac coupling is introduced to at least one of the data feeds intermediate the first and second mixing means.

In one embodiment a transmitter and receiver are combined and is hereinafter referred to as a transceiver. In one embodiment two or more transceivers are provided as part of the integrated circuit, each provided with an outlet to be connected to a broadcast data receiver.

In one embodiment the input is from a data distribution system.

In one embodiment the input is provided separately to each of the integrated circuits which are provided in parallel. Alternatively the input is provided to a first integrated circuit which acts as a master integrated circuit and is then passed therefrom to one or more "slave" integrated circuits, each having at least one transmitter and/or receiver formed thereon.

In one embodiment a terrestrial digital data system is provided and data provided therefrom is connected to the broadcast data receivers separately or is combined in a single outlet feed with the output from the integrated circuit to the broadcast data receiver.

In one embodiment a source can be any, or any combination of a digital terrestrial, satellite digital and/or analogue based system.

Typically the apparatus as herein described is located at or within the broadcast data receiver or alternatively can be provided at or close to a premises and from which one or more broadcast data receiver within the particular premises, such as a house or an apartment, can be located. In one embodiment the input is provided from an optical data distribution network.

In a further aspect of the invention there is provided a method for the receipt and processing of data signals carried in a plurality of predefined frequency bands, characterised by said method comprising the steps of generating a signal to identify the wanted frequency band to be selected from the said predefined frequency bands and from which data is to be retrieved, passing the data signals from the wanted band to a transmitter including first mixing means to process the data signals using in-phase and quadrative data feeds to create a predefined representation of the wanted frequency band, and passing the data from the two data paths to a second mixing means to convert the wanted frequency band to the required frequency band for receipt by at least one broadcast data receiver and/or one or more tuners connected to an outlet and providing the said transmitter as part of an integrated circuit.

In one embodiment when a selection of a wanted frequency band is made and the wanted frequency band is a different frequency band to that which is being processed by the apparatus at that time a signal is changed to identify the wanted frequency band and cause the wanted frequency band to be passed to the transmitter and, in turn, the outlet.

In one embodiment there are provided a plurality of frequency bands to a common feed and a substantially similar processing architecture is used for each of the bands.

Preferably for the wanted band the aim is to locate the same at or around DC and as close as possible thereto in order that the filtering that is required to be performed is minimised.

Typically in order to select another band the Local oscillator feed is adjusted.

Typically the wanted frequencies of the band are selected with respect to the system requirements including those of the broadcast data receiver and the particular channel of the data which is required by the receiver at that time as a result of a particular user selection which is made to view and/or listen to a particular channel on which a desired programme is being shown.

Typically, if the condition of the receiver is changed, for example as a result of a new user selection having been made to view or listen to a new television or radio programme, a signal indicating the change request is sent and, if the new data required is carried on a different frequency band, the new band is selected and then processed in place of the previous band.

In one embodiment, if, or when, the frequencies used by the transponders from the satellite change, the apparatus will recalibrate such that the zero frequency spur/notch is still positioned between the transponders.

In one embodiment where the apparatus is used in a relatively small scale "domestic" environment this recalibration can be achieved by the premises dweller turning off and on the apparatus as and when required.

Typically, where the apparatus is provided as part of a larger scale system in order to allow the need for recalibration to be identified whilst also ensuring that the provision of the audio and video is maintained, the power level after the first mixer centred around zero frequency is measured, preferably periodically and the apparatus initiates a recalibration should the power measured increase above a predefined level, which would signify the appearance of a transponder coinciding with the spur. In this way the apparatus can recalibrate as and when necessary without the need for human intervention to do so.

In one embodiment the positioning of the gap allows any unwanted second spur and/or notch, which are typically caused by implementation errors, to be positioned in the said gap and therefore do not effect the performance of the apparatus.

In one embodiment the knowledge of the location of the transponder gap is used when setting the on chip oscillator frequencies such that they do not interact.

In one embodiment the transponder gap identification is undertaken when switching on the apparatus and/or can be provided to be dynamic during the operation of the apparatus.

In one embodiment the apparatus does not assume any predefined transponder frequency allocation but typically the allocation is static while the apparatus is powered and the maximum transponder bandwidth is less than the available tuning on the circuit.

In one embodiment, if only a single channel is utilised the other channel can be used to verify that the satellite transponder frequency allocation remains unchanged and, if a change is detected, a temporary interruption to the output signal occurs in order to correct the frequency plan.

Typically at least the integrated circuit which includes the transmitter and/or receiver as herein described is located within the broadcast data receiver or adjacent to the broadcast data receiver and can be particularly useful with apparatus used to distribute the data to multiple dweller units.

BRIEF DESCRIPTION OF THE SEVERAL VIEW OF THE DRAWINGS

Specific examples of the invention are now described with reference to the accompanying diagrams; wherein FIG. 1 illustrates, schematically, a broadcast data system in accordance with one embodiment of the invention;

FIGS. 2a-c illustrates different embodiment of the integrated circuit provided in accordance with the invention;

BRIEF DESCRIPTION OF THE INVENTION

Figure 1:
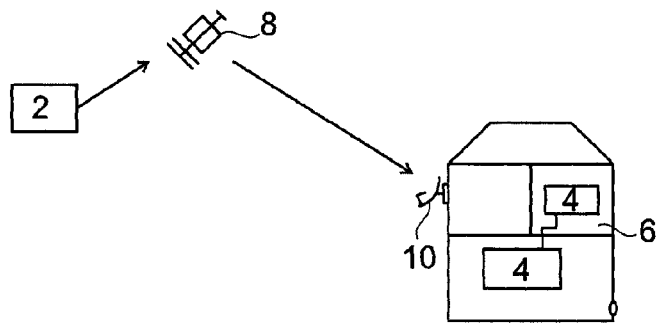

Referring firstly to FIG. 1 there is illustrated a broadcast data system of the type with which the current invention can be integrated.

The system comprises at least one broadcast or data transmission location 2 from which transport streams of digital data representing television and/or radio channels are carried.

Typically the data is carried on the different bands at different frequencies and there is a need for the same to be selected and processed in response to a user selection to view a particular programme on a particular channel with the selection made, typically by a user via a broadcast data receiver 4 provided at the remote geographical location 6 at which the television and/or radio and/or other services are to be generated from the broadcast data.

In this embodiment the data which is broadcast is transmitted to at least one satellite 8 from which the data is then transmitted to a plurality of receiving locations, one of which, 6 is shown. At each of the receiving locations there is typically provided at least one set of receiving means, including an LNB and an antenna assembly 10. The receiving location 6 can include multiple dweller units such as a block of apartments or an housing estate such that each of the units are provided with data from the common receiving means but the user at each of the multiple dweller units can select, independently of the other users via their own broadcast data receiver 4, which programme and hence which data is required to be passed and processed to their unit. The user interaction is typically achieved via the at least one broadcast data receiver provided at the unit. It should also be appreciated that the invention is also an advantage in a single dweller unit location 6, as shown in the FIG. 1, in which several broadcast data receivers 4 can be provided in different rooms of the same house.

It should therefore be appreciated that any reference herein to multi dweller units should also be taken to encompass a house with multiple rooms.

There is provided in accordance with the invention a number of embodiments of integrated circuits which can be installed, most typically at the location of the broadcast data receiver 4, but in other embodiments in connection with a distribution network connected to the broadcast data receivers 4, which allows the wanted frequency band of the received data to be selected obtained and from which particular band the data for a user selected channel can be obtained and then processed in order to allow the data for the user selected programme channel to be available. In one embodiment a plurality of integrated circuits in accordance with the invention can be provided to form the apparatus of the invention.

Figure 2A:
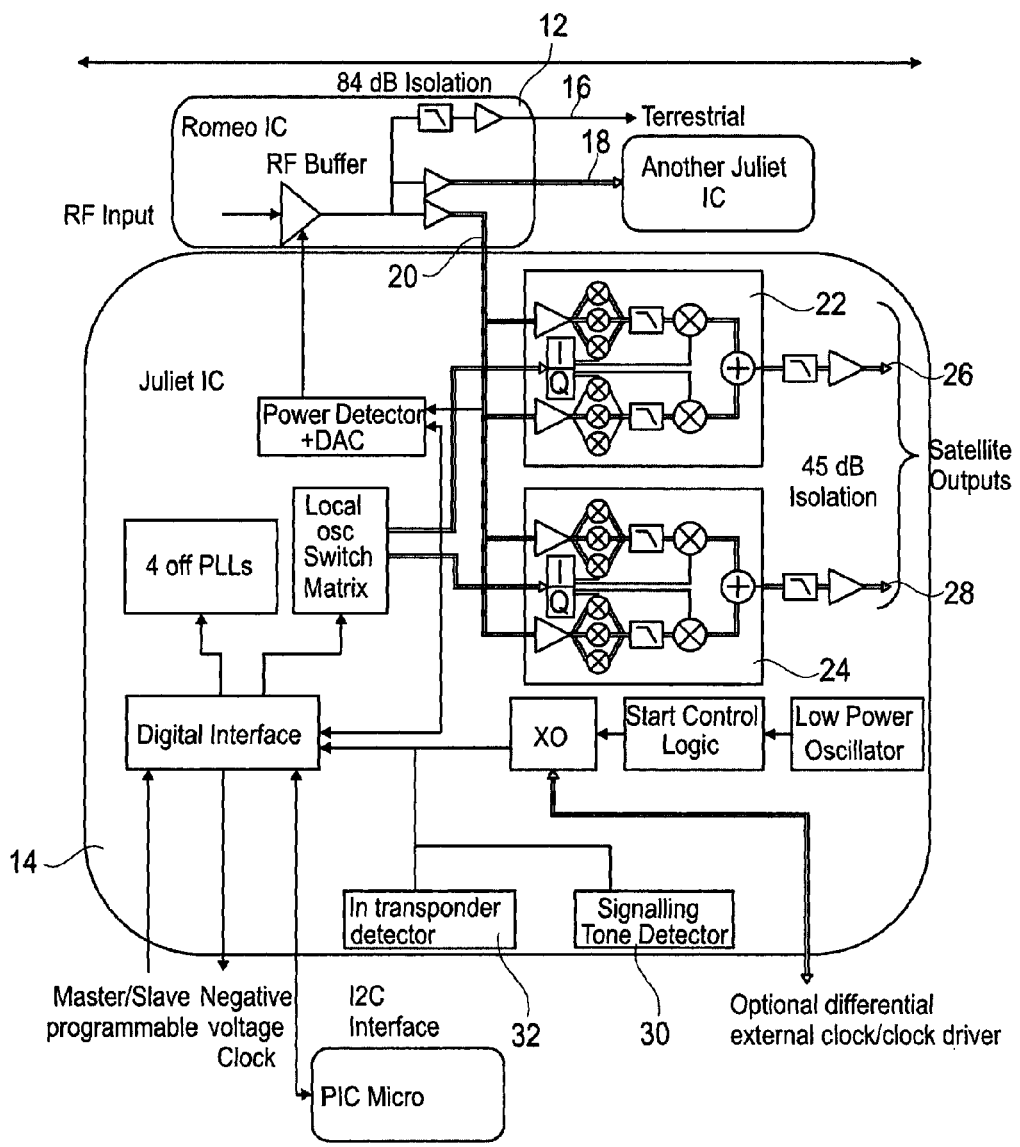

In a first embodiment, shown in FIG. 2a there is provided a system which includes two separate integrated circuits (I.C) 12,14 a first IC 12 including an LNA with an amplified low pass filter terrestrial output 16 and two composite four band (0.95-5.45 GHz) satellite outputs 18,20. Although shown adjacent the second integrated circuit 14 in this Figure it should be appreciated that the first integrated circuit 12 may be physically remote from the second IC 14.

In this case the second IC 14 is provided with two, combined transmitter and receiver, hereinafter referred to as a transceivers such that dual homodyne transceivers 22,24 are provided for filtering and transmitting the wanted frequency band to the broadcast data receiver 4 connected to the outputs 26,28. The IC 14 also includes a detector 30 for detecting the control signal from the broadcast data receiver which determines which of the received frequency bands is to be the wanted frequency band in response to a user selection made via the broadcast data receiver 4. The said detector is connected to the transponder detector 32.

Figure 3:
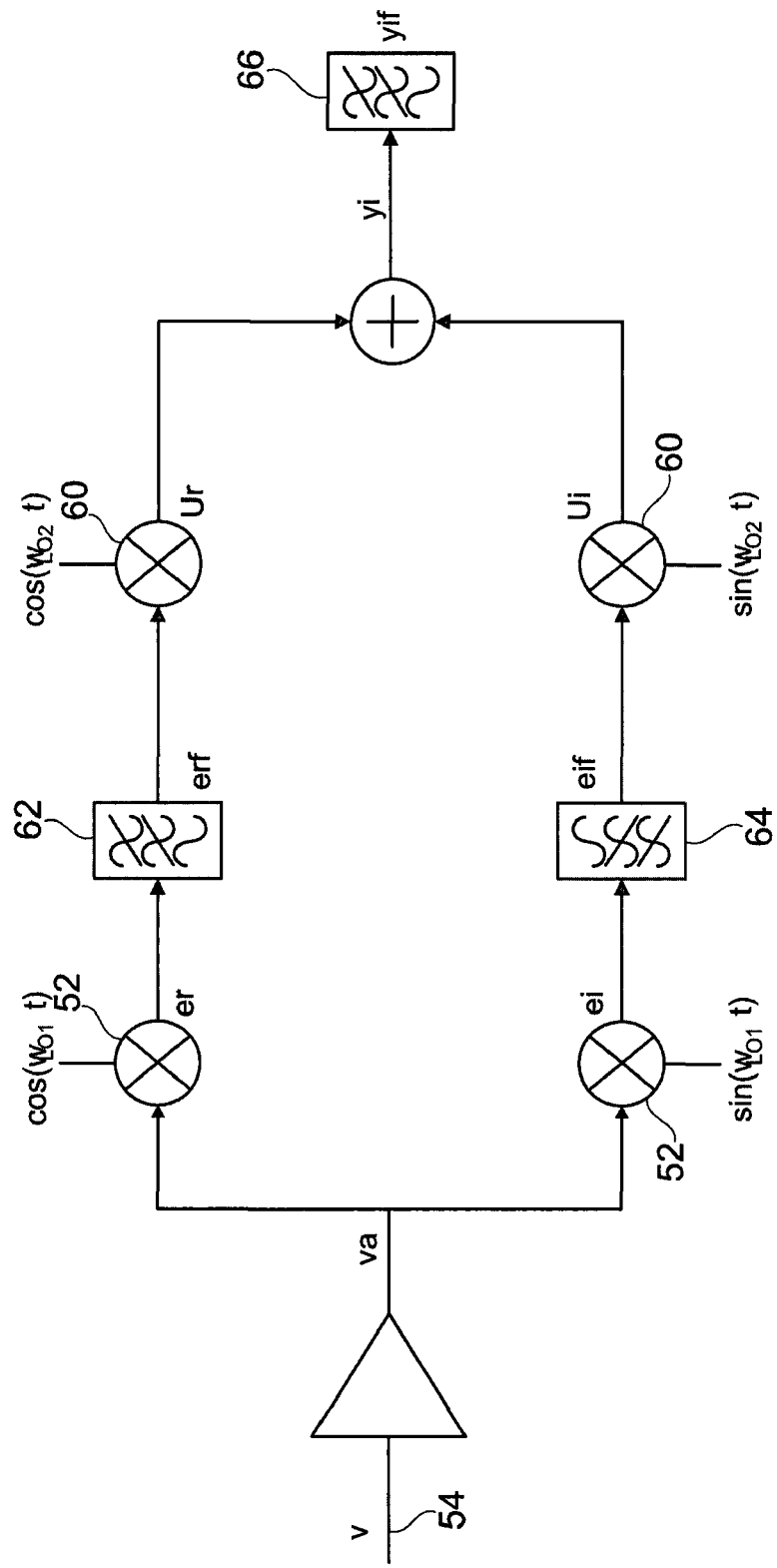
FIG. 3 illustrates one example of circuitry for use in the transceiver in one embodiment.
Figure 5:
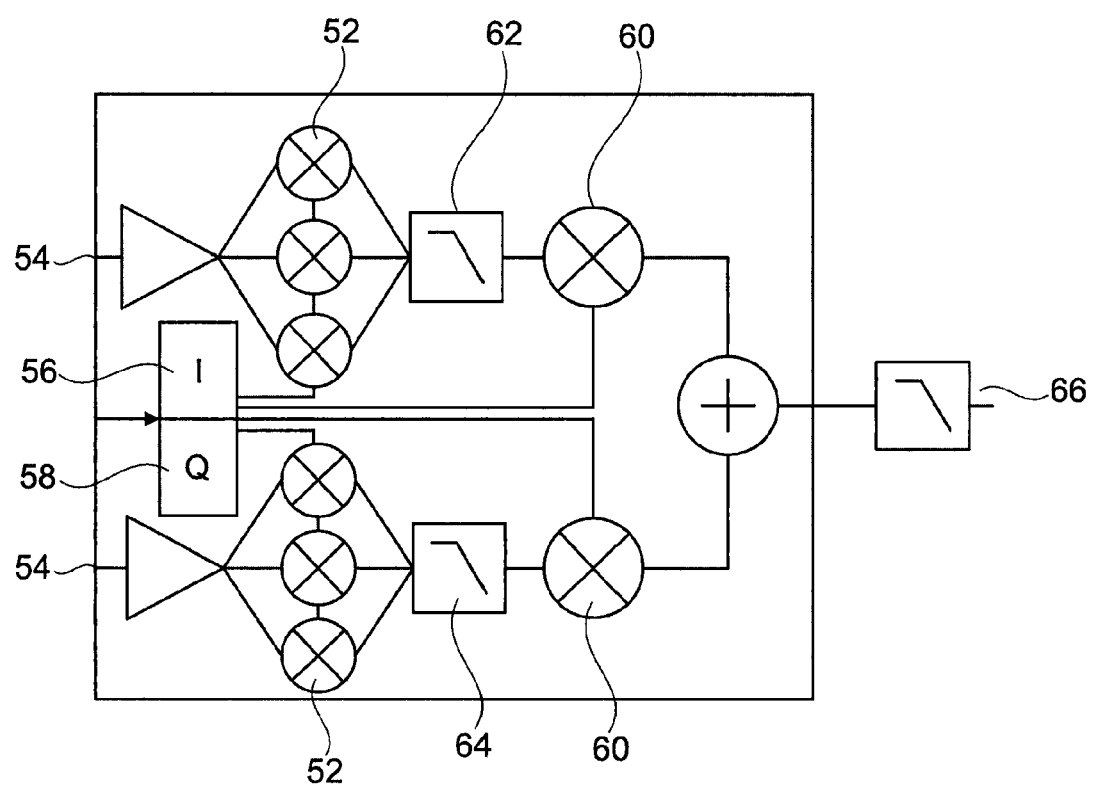
FIG. 5 illustrates a transceiver in accordance with an embodiment of the invention.

In each transceiver, examples of which are shown in FIGS. 3 and 5, there are provided first mixing means 52 to process the data signals of the said wanted frequency band from input 54. As shown in FIG. 5, in-phase and quadrative data paths 56, 58 can typically be provided to create a predefined representation of the wanted frequency band and which feed the first mixing means 52 and the second mixing means 60 respectively, as shown in FIG. 5. The data from the first mixing means 52 is passed along the respective data feeds to the second mixing means 60 via respective filters 62,64 to convert the wanted frequency band to the required frequency band output for receipt by at least one broadcast data receiver and/or one or more tuners connected to an output 66 of the apparatus.

Typically the apparatus includes a power detector, RF amplitude gain control (RFAGC) and I and Q harmonic reject mixer, a baseband low pass band select filter, a DC offset removal circuit, IQ modulator, RF filtering and the ability to detect the presence of the transponders in each frequency band and hence the gaps between the same.

Figure 2B:
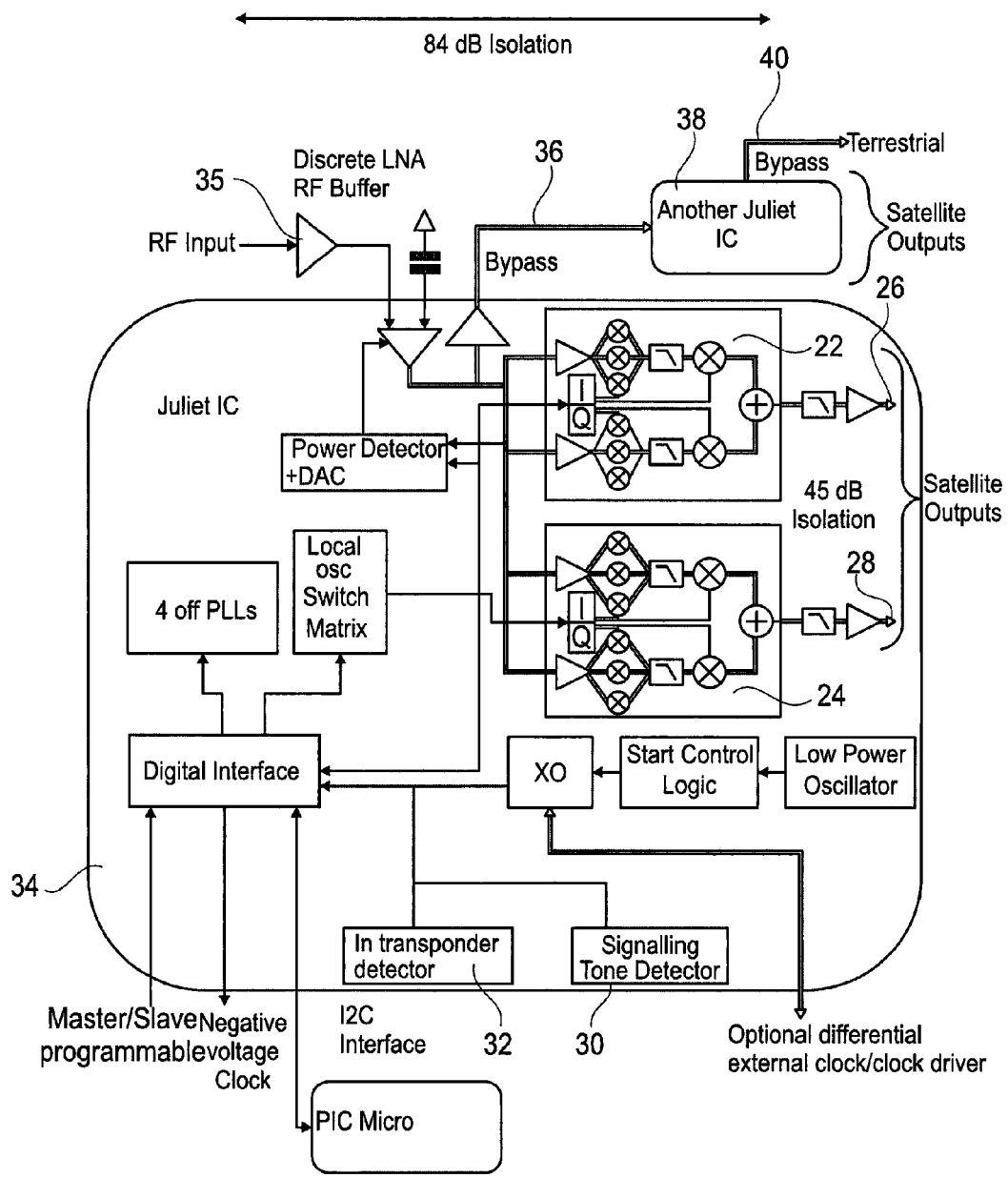

In the second embodiment shown in FIG. 2b there is provided a single IC 34 and an external Low Noise amplifier (LNA) 35 and in this case a broadband RF signal 36 is split at the receiver IC and routed via a bypass function. The bypass function allows a duplicate IC 38, or a terrestrial band 40, or both, to be driven via a daisy chain network. Once again the IC includes dual homodyne transceivers 22,24 for filtering and transmitting the wanted frequency band from those frequency bands which are received, and then passing the required data signals to the broadcast data receiver connected to the outputs 26,28. The IC 34 also includes a detector 30 for detecting the control signal which determines which of the received frequency bands is to be the wanted frequency band in response to a user selection made via the broadcast data receiver 4. The said detector is connected to the in transponder detector 32. With regard to this embodiment the same radio architecture can be utilised for each band.

Figure 2C:
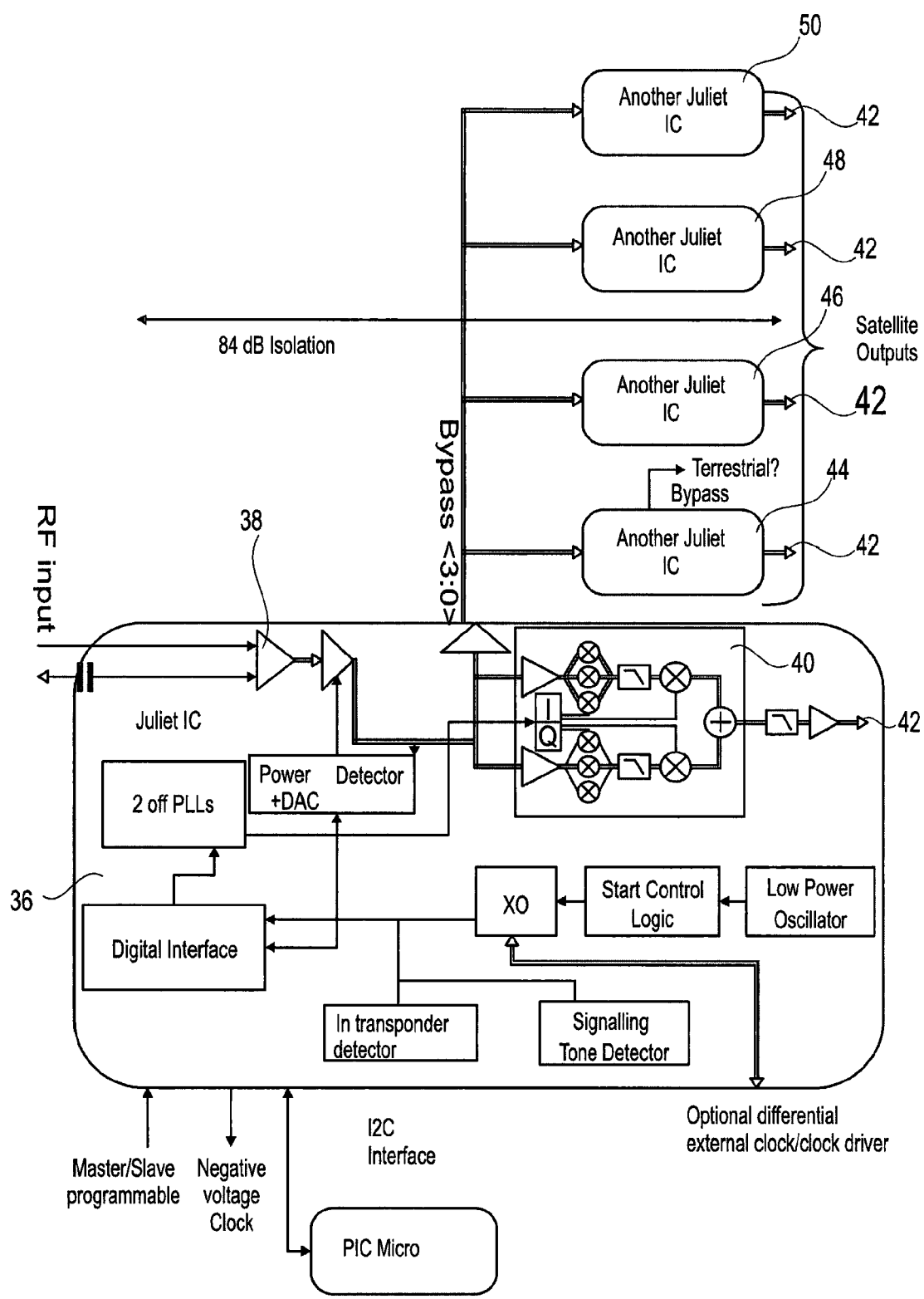

In a further embodiment shown in FIG. 2c there is provided a single IC 36 in which the LNA 38 and architecture in the form of a single homodyne transceiver 40 for a single channel output 42 is formed on an integral silicon die. The architecture used can be the same as the previous two embodiments for the single output. In this case a the IC chip 36 is duplicated in a number of IC chips 44-50, each of which is provided with an output and can be connected to a broadcast data receiver. Typically the broadcast data receiver will be connected to two of the outputs 42, or more if more tuners are provided in the broadcast data receiver.

Figure 4:
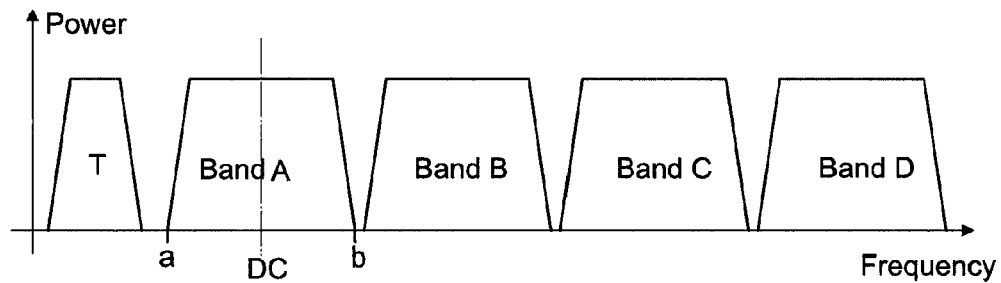
FIG. 4 illustrates an example of the four frequency bands which may be received by a satellite transmission system in accordance with the invention and a terrestrial service band and the respective frequency bands of the same at input and at the output from the IC.

In whichever embodiment, the provision of the components on an integrated circuit basis reduces size, keeps costs down and lends itself more readily to large volume production. In each case the IC which includes the transceivers is able to accept any one of the received frequency bands A,B,C,D, and a terrestrial service band T, as shown in FIG. 4, with one of the frequency bands being identified as the wanted frequency band. The frequency bands may be skewed when received from the LNA. In one embodiment the wanted frequency band is centred on DC as illustrated in FIG. 4 in which the wanted frequency band is band A and is centred on the line DC with regard to the frequency range "a" to "b". However the location of the frequency range may be altered such that a gap between known transponder frequency ranges in the wanted frequency band is centred on, or close to, DC rather than the centring of the wanted frequency band but even in this scenario it will most typically be the gap which is closest to the centre of the frequency range "ab" of the wanted frequency band that is located on or around DC. The IC is also able to detect the wanted frequency band in response to the user selection made via the broadcast data receiver upon receipt of a signal from the broadcast data receiver and also be able to correct any error in the signals received and output the wanted frequency band to the broadcast data receiver.

Typically, upon commencement of the operation of the system the apparatus in accordance with the invention will identify the location of the transponder frequencies in each of the frequency bands which is received and, in turn, identify the frequency gaps between the respective transponders in each frequency band. One of those gaps is then allocated to be located as close to DC as possible by adjusting the PLL frequencies. This ensures that any unwanted signals such as notches and spurs which are located in the band, and which may occur at DC, are located in the gap and so does not affect any of the transponder frequency ranges. This can be checked by for example, detecting whether there are signals around DC after a down conversion stage of the processing of the wanted frequency band. If there are then this indicates that the spur and notch are located within a transponder frequency range but if there are no signals, say less than 12 dB, then the spur and notch can be identified as being in the gap.

In one embodiment the apparatus includes at least two outputs which are connected to broadcast data receivers which can be operated independently to allow each user to select a channel on which a television or radio programme is located, independently of the other. In one embodiment, the data is passed to the apparatus of the invention optically, although an RF format can be used.

In whichever embodiment the wanted frequency band is obtained typically by selecting the appropriate phase lock loop (PLL) feed of a suitable clock rate for the wanted frequency band. The wanted frequency band is selected and the identified gap, typically that which is closest to the centre of the wanted frequency band frequency range, is positioned as close is practically possible to DC and this is then mixed up using complex in-phase and quadrature mixing with a local oscillator such that the band is converted to the desired frequency output. The remainder of the bands are filtered out so that only the wanted band is fed to the broadcast data receiver at the output and then the appropriate transponder frequency range can be selected in order for the appropriate television or radio programme to be provided to the broadcast data receiver user.

In order to select another band which is then wanted, a signals is generated and the Local oscillator frequency is adjusted to be able to receive the wanted frequency band.

Typically the wanted frequency bands are set by the system requirements and may therefore vary from system to system. However they will be predetermined so that the system knows what band is required for each programme channel which may be selected by the user via the broadcast data receiver.

In one embodiment an unwanted signal may be generated in the middle of the wanted band in which case AC coupling can be introduced before the second mixer which may in turn cause a further problem with the bit error rate of the data received from the wanted band. However this problem is also addressed in the current invention in the following manner.

Within each wanted band there is located a series of transponders in a spaced relationship across the wanted band, with each transponder typically representing a channel which is selectable to be viewed and/or listened to and there is a need to maintain the Transfer Function between the data input and output in the system so that the service is provided in the required form to the user.

In this embodiment, rather then move the centre of the wanted band to DC, it is the gap between transponders which is positioned closest to the DC which is moved to the DC. This therefore ensures that any unwanted signal which is generated at the middle or DC of the wanted band will be located in a gap between the transponders. This therefore means that any loss of signal or increase in the Bit Error Rate which could possibly occur to the channels is avoided as the possible effects of the signal are located in the gap between the transponders rather than having influence at the transponder location.

One advantage of the architecture is the ability to remove the requirement for switches in the output, and to save space and cost as a result, in certain embodiments.

In one embodiment the output can also include data for terrestrial systems which can be output separately or be diplexed into the existing outputs. In another embodiment the invention can be used in a hybrid network in connection with a coaxial and/or optical cable distribution system and is not directly connected to one or more broadcast data receivers. In this case one or more switches may be provided between the device of the invention and one or more receivers.

In a further example of the invention reference is made to the table below which sets out a frequency scheme with which the apparatus and method can be used. In each case the output band columns indicate the frequencies which are output from the apparatus and provided to be carried to the broadcast data receiver connected to the input. The fibre stack frequency columns indicate the different frequency bands which can selectively be provided from the input to the apparatus of the invention and any of which can be selectively identified as the "wanted" frequency band to be processed. The columns headed ASIC RxLo and TxLo are the local oscillator frequencies used in the apparatus:

| Fibre Stack Freq | | ASIC: | | Output Bands | |
|---|---|---|---|---|---|
| | | Rx LO | Tx LO | | |
| 950 | 2150 | 1550 | 1550 | 950 | 2150 |
| 3700 | 2500 | 3100 | 1550 | 950 | 2150 |
| 4050 | 5250 | 4650 | 1550 | 950 | 2150 |
| 6800 | 5600 | 6200 | 1550 | 950 | 2150 |

It should be noted that in this example the frequency bands of second and fourth inputs are inverted. In accordance with the apparatus of the invention the apparatus also inverts these frequency bands when they are the wanted band, so that at the Output the band is not inverted and this is achieved in the apparatus by adjusting the phases of the Lo and RF signals appropriately.

Typically the software provided in order to implement operation of the apparatus of the invention can be selectively programmed to allow reception of specific frequency bands in accordance with the operation characteristics of the particular system with which the same are being used.

There is therefore provided in accordance with the invention, apparatus and a method which allow at least the transceiver, but preferably other components, to be provided as part of one or two integrated circuits whilst still achieving the required consistency and quality of output signal therefrom. This represents significant savings in the provision of apparatus of the type which conventionally is provided by the joining together and interconnecting of components.

While the invention has been described with a certain degree of particularity, changes could be made in the details of construction and the arrangement of components without departing from the spirit and scope of this disclosure. The invention is not limited to the embodiments described here, but is limited only by the scope of the attached claims, including the full range of equivalency to which each element thereof is entitled.

The invention claimed is:

1. Apparatus for the receipt and processing of data signals from a digital data distribution system receiving data via satellite and/or cable distribution systems, and/or digital terrestrial system and/or analogue based system, said data signals carried in a plurality of predefined frequency bands, said apparatus comprising:
   means to allow the communication of a signal to identify a wanted frequency band to be selected from the predefined frequency bands and from which data is to be retrieved from, and
   at least first and second transmitter and receiver combination, each of said transmitters has an input with two data feeds leading to first mixing means for processing the data signals retrieved from the wanted frequency band and passing the data from the two data feeds via filters to a second mixing means for converting the wanted frequency band to a required frequency band for receipt by independently operable broadcast data receivers and/or tuners respectively connected to outputs from the transmitters, wherein the apparatus includes two separate integrated circuits, the first integrated circuit of the two separate integrated circuits including a low noise amplifier and a second integrated circuit of the two separate integrated circuits receiving an output from the first integrated circuit and including the first and second transmitter and receiver combinations, each provided to filter and transmit the wanted frequency band to the broadcast data receivers connected to a respective output, each of the transmitter and receiver combinations including in-phase and quadrative data paths to create a predefined representation of the wanted frequency band and which feed the first mixing means and the second mixing means respectively, said second integrated circuit further including a detector for detecting a control signal from the broadcast data receivers to determine which of the received frequency bands is to be the wanted frequency band in response to a user selection made via the broadcast data receivers and the detector connected to a transponder detector to allow the wanted frequency band to be selected.

2. Apparatus according to claim 1 wherein one output is provided for each one or more tuners.

3. Apparatus according to claim 1 wherein the first mixing means centre the wanted frequency band around direct current and allows the filtering of the wanted frequency band.

4. Apparatus according to claim 1 wherein a range of transponder frequencies within the wanted frequency band is identified and a gap between transponder frequencies in the wanted frequency band is moved to, or adjacent to, direct current by the first mixing means.

5. Apparatus according to claim 4 wherein the gap between transponder frequencies in the wanted band located closest to the centre of the wanted frequency band is that which is moved to direct current by the first mixing means.

6. Apparatus according to claim 1 wherein the input is provided separately to each of a plurality of integrated circuits, each circuit including at least one transmitter and/or receiver and which integrated circuits are arranged in parallel.

7. Apparatus according to claim 1 wherein data received from the digital terrestrial system is connected to the broadcast data receiver and/or tuners directly or is combined with an output from the apparatus.

8. A method for the receipt and processing of data signals from a digital data distribution system receiving data via satellite and/or cable distribution systems, and/or digital terrestrial system and/or analogue based system, said data signals carried in a plurality of predefined frequency bands, said method comprising the steps of:
   generating a signal to identify a wanted frequency band to be selected from the predefined frequency bands and from which data is to be retrieved;
   passing the data signals from the wanted frequency band to a transmitter including first mixing means to process the data signals using in-phase and quadrative data feeds to create a predefined representation of the wanted frequency band: and
   passing the data from the two data paths to a second mixing means to convert the wanted frequency band to the required frequency band for receipt by at least one broadcast data receiver and/or one or more tuners
   wherein the apparatus includes two separate integrated circuits, a first integrated circuit of the two separate integrated circuits including a low noise amplifier, and a second integrated circuit of the two separate integrated circuits receiving an output from the first integrated circuit and including two transmitter and receiver combinations, each provided to filter and transmit the wanted frequency band to the broadcast data receiver connected to a respective output, each of the transmitter and receiver combinations including in-phase and quadrative data paths to create a predefined representation of the wanted frequency band and which feed the first mixing means and the second mixing means respectively said second integrated circuit further including a detector for detecting a control signal from the at least one broadcast data receiver to determine which of the received frequency bands is to be the wanted frequency band in response to a user selection made via the at least one broadcast data receiver and the detector connected to a transponder detector to allow the wanted frequency band to be selected.

9. A method according to claim 8 including providing a plurality of frequency bands to a common inlet and which can be selected to pass through the inlet in response to a user selection made via the broadcast data receiver.

10. A method according to claim 8 including locating the wanted frequency band at or around direct current so as to minimize required filtering.

11. A method according to claim 8 including adjusting a local oscillator feed to select a different wanted frequency band.

12. A method according claim 8 including selecting the wanted frequency band with respect to requirements of operation of the broadcast data receiver and a particular channel of the data required by the broadcast data receiver at that time as a result of a particular user selection.

13. A method according to claim 8 including performing a recalibration step if the frequencies bands transmitted to the apparatus changes.

14. A method according to claim 8 including identifying a range of transponder frequencies within the wanted frequency band and moving a gap between the transponder frequencies in the wanted frequency band to direct current by the first mixing means.

15. A method according to claim 14 wherein the gap between transponder frequencies in the wanted frequency band, which is located closest to the centre of the wanted frequency band, is that which is moved to direct current by the first mixing means.

16. A method according to claim 14 wherein the gap identified is undertaken when switching on the apparatus and/or can be provided to be dynamic during the operation of the apparatus.

17. A method according to claim 14 including using knowledge of a location of the transponder gap when setting one chip oscillator frequencies so that they do not interact.

* * * * *